United States Patent [19]

McLeod et al.

[11] Patent Number: 4,961,159

[45] Date of Patent: * Oct. 2, 1990

[54] CELLULAR AUTOMATON FOR GENERATING RANDOM DATA

[75] Inventors: Robert McLeod; Howard Card, both of Winnipeg, Canada; Peter Hortensius, Goldens Bridge, N.Y.; Werner Pries, Steinbach, Canada

[73] Assignee: University of Manitoba, Manitoba, Canada

[*] Notice: The portion of the term of this patent subsequent to Aug. 22, 2006 has been disclaimed.

[21] Appl. No.: 392,637

[22] Filed: Aug. 11, 1989

Related U.S. Application Data

[63] Continuation-in-part of Ser. No. 112,118, Oct. 26, 1987, Pat. No. 4,860,236.

[51] Int. Cl.[5] .............................................. G06F 1/02
[52] U.S. Cl. .................................................... 364/717
[58] Field of Search .......................... 364/717; 333/78; 307/471

[56] References Cited

U.S. PATENT DOCUMENTS

| | | | |
|---|---|---|---|
| 3,751,648 | 8/1973 | Wu | 364/717 |
| 3,885,139 | 5/1975 | Hurd | 364/717 |
| 4,320,513 | 3/1982 | Lampert | 331/78 X |

Primary Examiner—Gary V. Harkcom
Assistant Examiner—Tan V. Mai
Attorney, Agent, or Firm—Marger, Johnson, McCollom & Stolowitz, Inc.

[57] ABSTRACT

A cellular automaton which generates pseudorandom data comprises a series of cells arranged such that each cell receives signals from electrically adjacent first and second cells. Each cell comprises a D-type flip-flop for storing a data bit, and logic circuitry which couples the flip-flop of the cell to those of associated first and second adjacent cells. The logic circuitry responds to the current state of the data bits stored by a particular cell and its associated first and second electrically adjacent cells by changing the value of the data bit stored by the particular cell according to a predetermined one of the following relationships:

$$a(t+1) = a_{first}(t) \text{ XOR } a_{second}(t), \text{ or}$$

$$a(t+1) = a_{first}(t) \text{ XOR } a(t) \text{ XOR } a_{second}(t)$$

where, $a(t)$ represents the current state of the data bit stored by the particular cell, $a(t+1)$ represents the next state of the data bit stored by the particular cell, $a_{first}(t)$ represents the current state of the data bit sotred by the first electrically adjacent cell, and $a_{second}(t)$ represents the current state of the data bit stored by the second electrically adjacent cell.

14 Claims, 5 Drawing Sheets

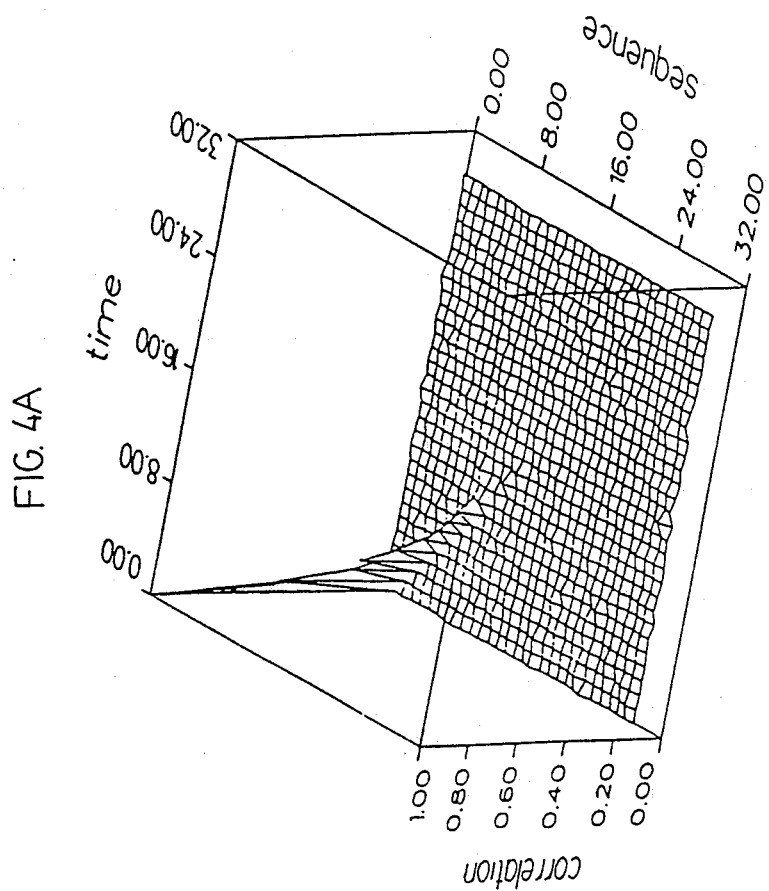

CELLULAR AUTOMATON FOR GENERATING RANDOM DATA

CROSS REFERENCE TO RELATED APPLICATION

This is a continuation-in-part of patent application Ser. No. 112,118 filed on Oct. 26, 1987, now U.S. Pat. No. 4,860,236, issued Aug. 22, 1989.

FIELD OF THE INVENTION

The invention relates to cellular automata which are capable of generating random data.

BACKGROUND OF THE INVENTION

The invention has specific, though by no means exclusive, application to digital circuits with built-in self-testing mechanisms, particularly those configured in modular form and appropriate, for example, for use in microprocessor-based systems employing buses for data and address transfer.

Such digital circuits may be functional modules such as read-only memories (ROM's), random access memories (RAM's), arithmetic logic units (ALU's), or input-/output (I/O) devices. Clocked latches would normally be used to interface such module's with data buses for data transfer. For purposes of self-testing, the latches might be replaced with built-in logic block observers (BILBO's), one such BILBO being associated with the input terminals of the modules principal circuit, and the other, with the output terminals. The BILBO's function not only as conventional data latches for purposes of normal module operation, but have modes of operation in which one BILBO serves as a pseudorandom data generator, applying various digital test patterns to the input terminals of the principal circuit associated with the module, and in which the other BILBO serves as a signature analyzer which compresses the output data produced by the circuit under test into a unique set of data bits or signature. The resulting signature can be compared with a predetermined expected signature to determine whether the circuit under test is functioning properly.

BILBO's have typically been shift registers with feedback logic gates coupling the output terminals of higher order flip-flops to a multiplexer associated with the input terminal of the lowest order flip-flop. With appropriate signal gating circuitry, and upon application of appropriate control signals to such circuitry, as, for example, to disable the feedback gates, the shift register can function in four distinct modes: as a conventional data latch; as a conventional linear shift register; as a pseudorandom data generator; and as a signature analyzer. As a pseudorandom data generator, the contents of the shift register runs through a pseudorandom sequence with a predetermined maximum period dependent on the number of flip-flops involved and the characteristic polynomial created by the associated feedback gates.

A principal problem associated with using linear feedback shift registers in such applications relates to the need to tap the output terminals of selected flip-flops in the shift register and to feed their state values through appropriate logic gates to a multiplexer associated with the lowest order bit. An immediate concern in selecting appropriate feedback taps is that their configuration is not independent of the length of the register for maximum length polynomial division. Another potential problem relates to finding an appropriate circuit topology which can accommodate the required feedback from higher order flip-flops to the input multiplexer, particularly as the shift register is made large.

SUMMARY OF THE INVENTION

In one aspect, the invention provides a cellular automaton which generates pseudorandom data. The automaton comprises a series of cells arranged such that each cell receives signals from first and second electrically adjacent cells. Each particular cell has a storage unit for electrically storing a data bit having two distinct states, and logic circuitry for coupling the storage unit of the particular cell to the storage unit of the associated first electrically adjacent cell and to the storage unit of the associated second electrically adjacent cell. The logic circuitry changes the value of the data bit stored by the particular cell according the following relationship:

$$a(t+1) = a_{first}(t) \text{ XOR } [a(t) \text{ OR } a_{second}(t)]$$

where, $a(t)$ represents the current state of the data bit stored by the particular cell, $a(t+1)$ represents the next state of the data bit stored by the particular cell, $a_{first}(t)$ represents the current state of the data bit stored by the first electrically adjacent cell, and $a_{second}(t)$ represents the current state of the data bit stored by the second electrically adjacent cell.

For binary cellular automata of this type, each site must determine its next value on the basis of the eight possible present values of itself, and the left and right neighbours (i.e. 000, 001, 010, etc.). The next state value corresponding to each possible input of the cellular automaton forms a number which is referred to as the Rule number. For example, the Rule number corresponding to the above described relationship is known as Rule 30 and the cellular automaton for realizing the relationship is known as a Rule 30 CA (cellular automaton).

A principal advantage of such automata is that the succeeding state of each cell is dependent only on the current state of the two electrically adjacent cells. The need to tap certain higher order bits and to feed state values back to a multiplexer, as has been characteristic of prior random data generators. incorporating linear feedback shift registers, has accordingly been eliminated. Basically, what has been provided is a unique cell design for construction of such cellular automata, which permits an automaton of any desired bit size to be constructed by effectively juxtaposing the required number of cells.

However, the bit sequences produced by a Rule 30 CA usually consist of cycles and paths to the cycles which vary greatly in length, with the result that the maximum average cycle length is in the vicinity of $2^{n/2}$, where n equals the number of cells in the automaton. For example, if it were desired to initialize a cyclic Rule 30 CA with an arbitrary starting state and require a probability of at least 0.9 that a non-repeating sequence of length greater than or equal to 1,000 will be produced, then a Rule 30 CA will be required having a size of greater than or equal to 15 cells.

It has been found that a cellular automaton which yields a maximal length binarY sequence from each cell is given by a combination of CA Rules 90 and 150 respectively,, as follows:

Rule 90: $a(t+1) = a_{first}(t) \text{ XOR } a_{second}(t)$, or

Rule 150: $a(t+1) = a_{first}(t) \text{ XOR } a(t) \text{ XOR } a_{second}(t)$

The combination rule cellular automaton or hybrid cellular automaton of the present invention yields maximum length cycles of $2^n - 1$. The hybrid CA can be made of any length and must have nil boundary conditions (i.e. the end cells must be configured such that they receive a low logic level as an input at the array boundary). The hybrid CA is characterized by autoplectic behavior since a regular starting pattern eventually dies out as the CA is successively clocked. The nil boundary conditions of the hybrid CA provide advantages over the aforementioned Rule 30 CA since the first and last sites of the hybrid do not need to be connected by a long wire. The boundary constraints also allow the hybrid to operate at a higher speed since no-extended wiring is required.

Unlike the Rule 30 CA, adjacent cells in the hybrid are not correlated in both time and space. This result has been borne out by auto and cross correlation studies of generated pseudorandom sequences in both the Rule 30 and hybrid Rule 90 and 150 cellular automata.

Other aspects and advantages associated with the present invention will be apparent from a description of a preferred embodiment below and will be more specifically defined in the appended claims.

DESCRIPTION OF THE DRAWINGS

The invention will be better understood with reference to drawings in which:

FIGS. 4A and 4B are graphs showing the degree of pseudorandom sequence data over time for the Rule 30 CA of FIG. 1 and hybrid Rule 90 and 150 CA of FIG. 3, respectively.

DESCRIPTION OF A PREFERRED EMBODIMENT

Figure 1:
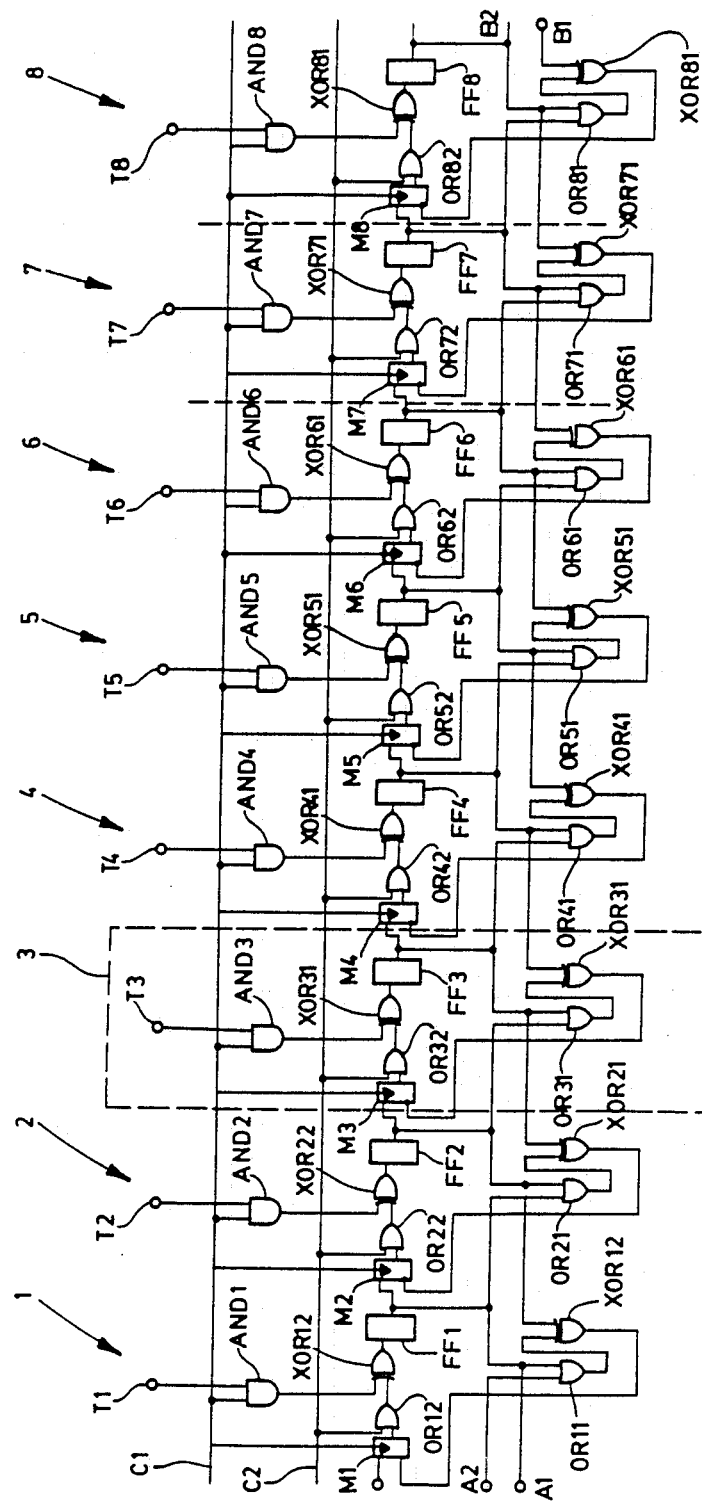
FIG. 1 schematically illustrates an eight-cell Rule 30 automaton embodying the invention.

Reference is made to FIG. 1 which illustrates an eight-cell Rule 30 automaton embodying the invention. The cells of the automaton have been designated with reference numerals 1-8 inclusive. The cells 1-8 are arranged in a series such that each of the cells 2-6 intermediate of end cells 1 and 8 is associated with first and second electrically adjacent cells. Each cell has two "electrically adjacent" cells in the sense that each cell receives cell state signals only from such cells. Terminals A1 and B1 associated with the end cells 1, 8 are preferably electrically connected and also terminals A2 and B2 associated with the end cells 1, 8 such that the cells 1-8 constitute a ring structure in which the cell 1 is associated with two electrically adjacent cells, namely, cells 2 and 8, and in which the cell 8 is associated with two electrically adjacent cells, namely, cells 1 and 7. Accordingly, each cell of the automaton may be seen to bear a similar relationship with two electrically adjacent cells.

Certain signal gating and control circuitry associated with each of the cells 1-8 responds to control signals applied to two control lines C1, C2 and to the logic states of data signals applied to eight data input terminals T1-T8. This arrangement permits the automaton to operate in four distinct operating modes: as a linear shift register, as a conventional data latch for storing data received at the eight input terminals, as a pseudorandom data generator, or as a signature analyzer which compresses data received at the eight data input terminals T1-T8 into a unique eight bit signature.

For purposes of understanding cell operation, the operations inherent in the cell 3 will be discussed below. Since the cells have identical configuration, common components of the various cells 1-8 have been indicated with common alphabetic designators followed by the appropriate cell number or the cell number and a second identifying numeral. It should be understood that the description provided regarding the configuration and internal operations of the cell 3 is equally applicable to the other cells.

The cell 3 comprises a D-type flip-flop FF3 which stores a single data bit having two distinct logic states. The current state of the data bit can be detected electrically at the output terminal associated with the flip-flop FF3. As is well known, a D-type flip-flop is characterized in that the next state of the flip-flop in response to a clock signal corresponds directly to the current state of the input signal applied to its input terminal. The cell structure can, however, be implemented with other types of flip-flops or storage units.

The cell 3 has logic circuitry which generates a logic signal in response to the current state of the flip-flop FF3 and the current states of the flip-flops FF2, FF4 of the electrically adjacent cells 2,4. This logic circuitry comprises an OR gate OR31 and an EXCLUSIVE OR gate XOR31. The gate OR31 has an input terminal connected to the output terminal of the flip-flop FF2 and another input terminal connected to the output terminal of the flip-flop FF3. The gate XOR31 has one input terminal which receives the signal generated by the gate OR31 and has another input terminal which is coupled to the output terminal of the flip-flop FF4 to detect the current state of its data bit. Accordingly, the logic circuitry produces an output signal as follows:

$a_4(t) \text{ XOR } [a_3(t) \text{ OR } a_2(t)]$ where, $a_2(t)$, $a_3(t)$ and $a_4(t)$ represent the current states of the flip-flops FF2, FF3, and FF4, respectively, at the time step number t of circuit operation. This logic signal is applied to the input terminal of the flip-flop FF3 when the automaton is operated as a pseudorandom data generator.

The cell 3 has signal gating circuitry which determines what signal is actually applied to the input terminal of the associated flip-flop FF3. This gating circuitry applies particular signals in response to the logic levels of control lines C1, C2 and the logic levels of the input terminals T1-T8. The signal gating circuitry includes a multiplexer M3 which receives the logic signal generated by the gate OR31 and the gate XOR31 and the state signal of adjacent cell 2. The multiplexer M3 is controlled by the control line C1, and provides at its output terminal the logic signal if the control line C1 is at a logic one, and the current state signal of the adjacent cell 2 if the control line C1 is at a logic zero. The signal gating circuitry also includes an AND gate AND3, an OR gate OR32, and an EXCLUSIVE OR gate XOR32. The gate AND3 has one input terminal coupled to control line C1 and another input terminal coupled to the data input terminal T3 to receive data bits applied thereto. The gate OR32 has one input terminal coupled to control line C2 and another to the output terminal of the multiplexer M3. The output signals generated by the gate OR32 and the gate AND3 are received by the gate XOR32. The output terminal of XOR32 is coupled directly to the input terminal associated with flip-flop FF3.

The operation of the cell 3 which is typical is best understood by considering various operating states for the control lines C1, C2.

If the control lines C1, C2 are both at logic zero values, the cells 1–8 of the automaton are configured to operate as a simple shift register. In the cell 3, for example, the output terminal of the gate AND3 is fixed at a logic zero. In response to the logic zero value of the control line C1, the multiplexer M3 simply passes the state value of the flip-flop FF2 of the adjacent cell 2. Since each of the gates OR32 and XOR32 has one of its terminals fixed at a logic zero, each simply passes the current logic state of the preceding flip-flop FF2, which is applied to the input terminal of the flip-flop FF3. Accordingly, upon application of a clock pulse to the flip-flops of the various cells, the flip-flop FF3 assumes the logic state of the adjacent flip-flop FF2. Accordingly, in this mode of operation, data bits are simply transmitted serially between the flip-flops 1–8 of the various cells.

When the control lines C1 and C2 are both set to logic high values, the automaton is configured to operate as a conventional data latch. With respect to the cell 3, it will be noted that the gate AND3 has one input terminal at the logic one associated with the control line C1 and consequently passes the data bit received at the data input terminal T3. Since the gate OR32 has one terminal fixed at a logic one, its output terminal is fixed at a logic one value and no data from the multiplexer M3 is passed by the gate OR32. Since one input terminal of the gate XOR32 is at a logic one, it acts as an invertor, inverting the state value of the data bit received at the input terminal T3. With the next system clock pulse, that inverted value of the data bit is recorded in the cell 3.

If the control terminal C1 is set to a logic one and the control terminal C2 to a logic zero, and an eight-bit data signal is applied to the input terminals T1 TB, the automaton operates as a signature analyzer. In the cell 3, for example, because the control line C1 is set at a logic one state, the multiplexer M3 passes the logic signal generated by the gate XOR31. The logic signal is in turn simply passed by the gate OR32, which has one input terminal fixed at the logic zero value associated with the control line C2. The gate AND3, which has one input terminal fixed at the logic one value associated with the control line C1, simply passes the data bit received at the data input terminal T3. Accordingly, gate XOR32 produces and applies to the input terminal of the flip-flop FF3 a signal which corresponds to the binary addition of the received data bit and the logic signal generated at the output terminal of the gate XOR31 in response to the current states of the flip-flop FF3 and its associated adjacent flip-flops 2, 4. Accordingly, after a predetermined number of clock pulses, data bits which have been applied to the input terminals T1–T8 during the clock pulses are compressed into a unique 8-bit signature which is stored in the cells 1–8.

If the control terminal C1 is set to a logic one and the control terminal C2 to a logical zero, as in the signature analyzing mode described above, and the input terminals T1–T8 are maintained at constant logic values, the automaton functions as a random data generator. It will be assumed that the logic states of each of the input terminals T1–T8 is maintained at a logic zero. With respect to the cell 3, the principal difference in cell operation from signal analyzer operation is that the gate XOR32 simply passes whatever signal is otherwise transmitted by the multiplexer M3 and the gate OR32. In such circumstances, the gate OR31 and the gate XOR31 associated with the cell 3 effectively apply the logic signal derived from the current states of the flip-flop FF3 and adjacent flip-flops 2, 4, to the input terminal of the flip-flop FF3, and the current value of the logic signal is adopted by the flip-flop FF3 at the next clock pulse. With repeated clocking of the cells 1–8, a series of pseudorandom numbers is generated at the output terminals of the associated flip-flops 1–8.

Several advantages of the automaton over prior devices incorporating shift registers with feedback logic gates should be noted. First, communication is local, being restricted to a particular cell and its immediately adjacent cells. The basic cell structure consequently constitutes a building block which can be used to immediately design an automaton of any desired cell size without the need to determine where feedback taps might be required. Second, because feedback taps-characteristic of prior shift register based BILBO's is not required, routing of conductors and components is markedly simplified, especially in respect of devices having a large number of cells.

Another aspect of the configuration of the automaton should be noted. It is not critical for purposes of generating pseudorandom data that the terminals A1 and B1 be connected and that the terminal A2 and B2 be connected. If the terminals A1, B1 are maintained at constant logic values, and the control and input signals applied to the automaton are appropriately set for random data generation, it is fully expected that the automaton will generate useful random data sequences, although a complete ring configuration is preferred for such purposes. Such end conditions are expected to have less impact on random data generation as the number of cells in an automaton embodying the invention is increased.

Figure 2:
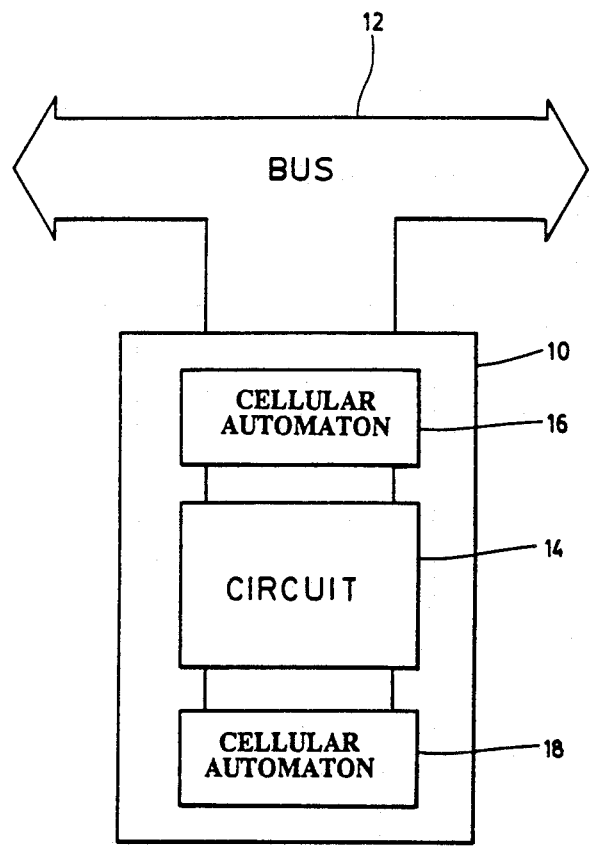
FIG. 2 schematically illustrates a typical application for the cellular automaton of FIG. 1.

Reference is made to FIG. 2 which illustrates a typical application for the automaton. In FIG. 2 a circuit module 10 is shown connected to a data bus 12. The module 10 may be seen to comprise a circuit 14 which may be a RAM, ROM, ALU or other digital device and to comprise two cellular automata 16, 18 substantially identical to the automaton illustrated in FIG. 1. In normal operation, the automaton 16 may serve as a latch for input of digital data from the bus 12 to the circuit 14, while the automaton 18 serves as an output latch for transfer of digital data to the bus 12. In self-testing of the circuit 14, the automaton 16 may be conditioned with appropriate control signals, as described above, to function as a random data generator, applying a stream of random binary numbers to the input terminals associated with the circuit 14. The automaton 18 may be simultaneously conditioned to operate as a signature analyzer, compressing the digital signals produced by the circuit 14 in response to the random binary data into an 8-bit signature. The signature can then be transmitted to a processor for comparison with a stored expected signature and for determination of circuit faults. The overall configuration of the self-testing module 10 of FIG. 2 is standard, and the general operation of the automata 10, 12 in such applications will be understood by persons skilled in the art.

Figure 3:
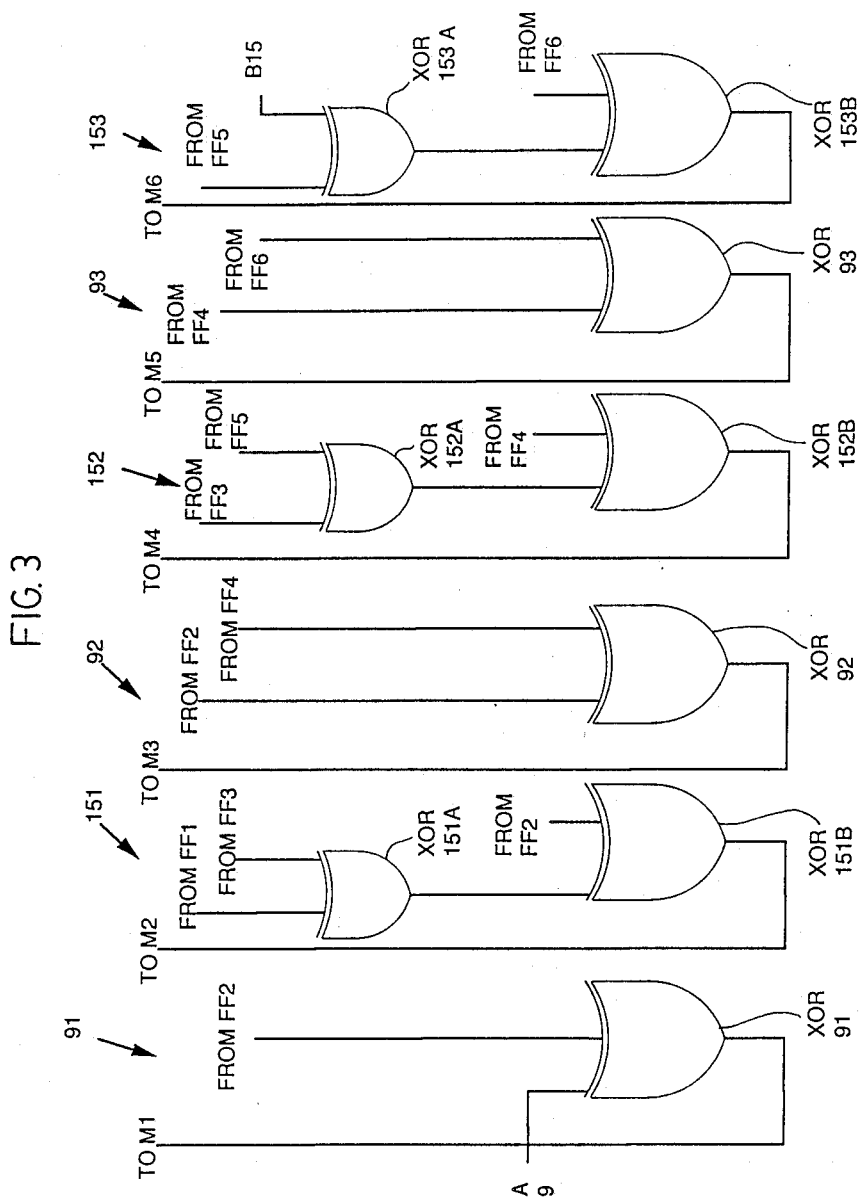
FIG. 3 schematically illustrates a single cell of a hybrid Rule 90 and 150 cellular automaton according to an alternative embodiment of the present invention.

As discussed above, an improvement in the correlation and maximum cycle length of pseudorandom number sequences generated by the Rule 30 CA of FIG. 1, may be obtained by a Rule 90 and 150 hybrid CA as shown in FIG. 3. A six-cell hybrid CA is shown comprising alternate Rule 90 and 150 hybrid cells 91-93 and 151-153. For ease of description, the additional logic and storage circuitry associated with each cell is not shown. However, it will be understood that the output of each cell 91-93 and 151-153 is connected to a corresponding input multiplexer (e.g. MI-M6 in FIG. 1), and the cell inputs are connected to predetermined flip-flop outputs in a manner similar to that shown in FIG. 1. Also, the logic and control circuitry for selecting the various operating modes of the automaton is not shown but would be identical to that illustrated in FIG. 1.

In other words, the circuitry associated with the cellular automaton of FIGS. 1 and 3 is identical except that the Rule 30 implementation of FIG. 1 which is realized by logic gates OR11-OR81 and XOR11-XOR81, which have been replaced in FIG. 3 by alternately arranged Rule 90 and 150 automaton cells. The Rule 90 CAs 91-93 are implemented by logic gates XOR91, XOR92 and XOR93 while the Rule 150 CAs 151-153 are implemented via gates XOR151A and B, XOR152A and B, and XOR153A and B.

The first cell 91 comprises an exclusive-OR logic gate XOR 91 having one input for receiving an initial logic value via terminal A9 and a second input for receiving a logic value from the output stage of the adjacent cell 151 (i.e. via associated flip-flop FF2). An output of XOR 91 is connected to an input of the associated multiplexer M1 (i.e. as shown in FIG. 1).

The last cell 153 comprises an exclusive-OR gate XOR153A having one input connected to the output of FF5 (i.e. the previous cell) and a second input connected to a terminal for receiving a further initial logic value. The output of XOR153A is connected to a first input of XOR153B, while the second input is connected directly to the output of flip-flop FF6. The output of XOR153B is also connected to an input of associated multiplexer M6.

In operation, the Rule 90 CAs (e.g. CA92) receive a first input signal (e.g. via an input of XOR92) from the previous cell flip-flop (e.g. FF2) and a second input signal from the subsequent cell output (e.g. FF4), such that the logic gate XOR92 produces an output signal as follows:

$$a_2(t) \; XOR \; a_4(t)$$

where $a_2(t)$ and $a_4(t)$ represent the current states of flip-flops FF2 and FF4, respectively, at the time step number t of circuit operation.

This logic signal is applied to one input terminal of multiplexer M3, and therefrom into an input terminal of associated D-type flip-flop FF3 in the event that the automaton is operated as a pseudorandom number generator.

Considering operation of the Rule 150 CAs (e.g. as exemplified by CA 152), a first input signal is received from flip-flop FF3 and applied to a first input of XOR152A while a second input signal is received from adjacent flip-flop FF5 and applied to a second input of XOR152A. The output of XOR152A is applied to one input of XOR152B, while the second input of XOR152B is connected directly to the output thereof. Accordingly, the logic circuitry of this Rule 150 CA produces an output signal as follows:

$$a_3(t) \; XOR \; a_4(t) \; XOR \; a_5(t)$$

where $a_3(t)$, $a_4(t)$ and $a_5(t)$ represent the current states of the flip-flops FF3, FF4 and FF5, respectively, at the time step number t of circuit operation. The output of this cell is connected to an input of the associated multiplexer M4.

The hybrid construction of FIG. 3 yields a cellular automaton with a maximum cycle length of 63.

Although the implementation of FIG. 3 shows Rule 90 and Rule 150 CAs arranged in an alternate pattern, the cellular automaton of the alternative embodiment of the present invention may be constructed with various arrangements of Rule 90 and 150 cells, depending on the length (i.e. number of cells) of the automaton.

For example, Table 1 below illustrates the hybrid constructions necessary to achieve a cellular automaton with maximal cycle length for a variety of different length automata. In Table 1, a "1" in the construction column refers to CA Rule 150 while the numeral "0" refers to CA Rule 90. Hence, a CA having 5 cells characterized by maximal length pseudorandom sequences would be constructed by having CA Rules 90 and 150 arranged in the following order:

150, 150, 90, 90, 150.

It should be noted that for many lengths, there are several CA Rule 90 and 150 hybrid constructions which will yield maximal length cycles. Maximal cycle length hybrid cellular automata also exist for lengths larger than 28 and are determined preferably by using computer simulation.

TABLE I

| Length | Construction | Cycle Length |
|---|---|---|
| 4 | 0101 | 15 |
| 5 | 11001 | 31 |
| 6 | 010101 | 63 |
| 7 | 1101010 | 127 |
| 8 | 11010101 | 255 |
| 9 | 110010101 | 511 |
| 10 | 0101010101 | 1,023 |
| 11 | 11010101010 | 2,047 |
| 12 | 010101010101 | 4,095 |
| 13 | 1100101010100 | 8,191 |
| 14 | 01111101111110 | 16,383 |
| 15 | 100100010100001 | 32,767 |
| 16 | 1101010101010101 | 65,535 |
| 17 | 01111101111110011 | 131,071 |
| 18 | 010101010101010101 | 262,143 |
| 19 | 0110100110110001001 | 524,867 |
| 20 | 11110011101101111111 | 1,048,575 |
| 21 | 011110011000001111011 | 2,097,151 |
| 22 | 0101010101010101010101 | 4,194,303 |
| 23 | 11010111001110100011010 | 8,388,607 |
| 24 | 111111010010110101010110 | 16,777,213 |
| 25 | 1011110101010100111100100 | 33,554,431 |
| 26 | 01011010110100010111011000 | 67,108,863 |
| 27 | 000011111000001100100001101 | 134,217,727 |
| 28 | 0101010101010101010101010101 | 268,435,455 |

Figure 4B:
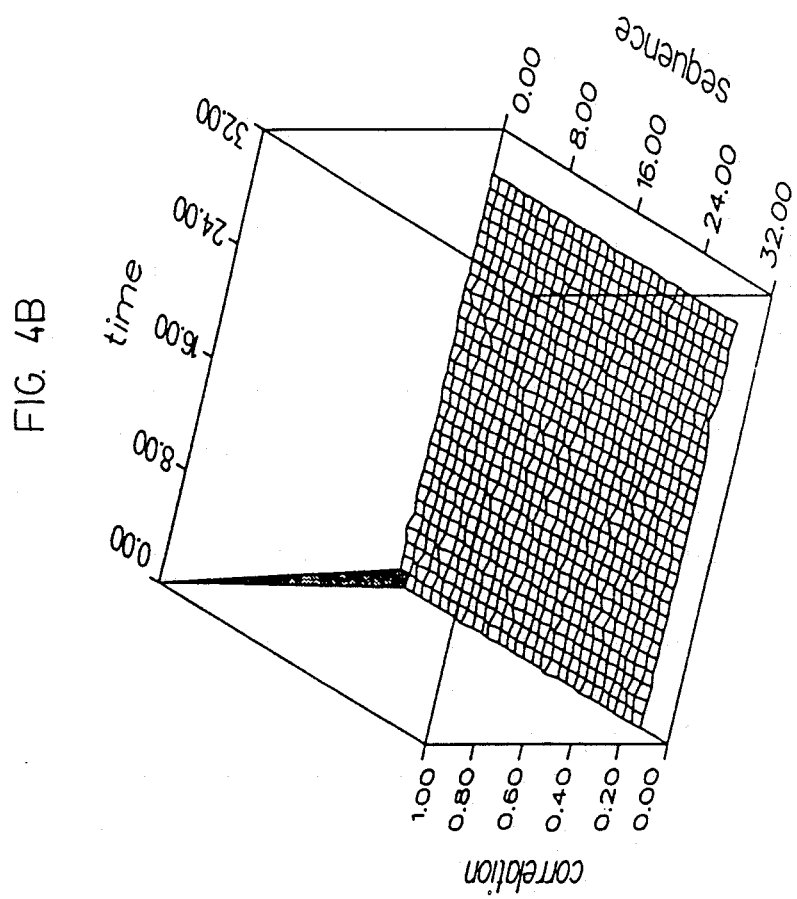

In addition to having greater maximal lengths, the pseudorandom sequences generated by the hybrid CA of FIG. 3 are characterized by significantly less correlation than the data sequences produced by Rule 30 CAs. A comparison of the cross correlation characteristics of the Rule 30 and hybrid Rules 90 and 150 automata are shown with reference to FIGS. 4A and 4B.

Although the automaton has been described herein largely in the context of self-testing circuits an important area of application, it should be noted that the one of the more significant aspects of the automaton is its ability to generate random numbers. In that regard, the cells of the automaton might be stripped of much of their signal gating circuitry so that the automaton functions solely as a random data generator. So adapted, the automaton is expected to provide a high-speed alternative to software-based random number generating routines.

It will be appreciated that a particular embodiment of the invention has been described in a specific context to illustrate the principles inherent in the invention. Accordingly, the specific teachings herein should not be regarded as necessarily limiting the spirit of the invention or the scope of the appended claims.

We claim:

1. A cellular automation which generates pseudorandom data, comprising:
   a series of cells arranged such that each cell receives signals from associated first and second electrically adjacent cells; each particular cell in the series of cells having
   (a) a storage unit for electrically storing a data bit having two distinct states, the storage unit having an output terminal where the current state of the data bit is electrically detectable; and
   (b) logic circuitry coupling the storage unit of the particular cell to the storage unit of the associated first electrically adjacent cell and to the storage unit of the second electrically adjacent cell, the logic circuitry responding to one of either
   (i) the current state of the data bit stored by the particular cell and the data bits stored by the first and second electrically adjacent cells by changing the value of the data bit stored by the particular cell according to the following relationship:

$a(t+1) = a_{first}(t)$ XOR $a(t)$ XOR $a_{second}(t)$, or
   (ii) the current state of the data bits stored by the first and second electrically adjacent cells by changing the value of the data bit stored by the particular cell according to the following relationship:

$a(t+1) = a_{first}(t)$ XOR $a_{second}(t)$, where $a(t)$ represents the current state of the data bit stored by the particular cell, $a(t+1)$ represents the next state of the data bit stored by the particular cell, $a_{first}(t)$ represents the current state of the data bit stored by the first electrically adjacent cell, and $a_{second}(t)$ represents the current state of the data bit stored by the second electrically adjacent cell.

2. A cellular automaton as claimed in claim 1 in which the storage unit of each of the series of cells comprises an input terminal for receiving an input signal having two distinct states, the storage unit changing the state of the stored data bit to conform to the current state of the input signal when a predetermined clock signal is applied to the storage unit.

3. A cellular automaton as claimed in claim 2 in which the logic circuitry of particular cell receives the output signal produced by the storage unit of the particular cell and the output signals produced by the storage units of the associated first and second electrically adjacent cells and applies to the input terminal of the storage unit of the particular cell a signal having the value $a_{first}(t)$ XOR $a(t)$ XOR $a_{second}(t)$.

4. A cellular automaton as claimed in claim 3 which is selectively switchable between a mode of operation in which the automaton produces the pseudorandom data and a mode of operation in which the automaton functions as a shift register, each of the series of cells comprising:
   controllable signal gating means for receiving at least the signal generated by the associated logic circuitry and the output signal produced by the storage unit of the associated first electrically adjacent cell and for selectively applying to the input terminal of the storage unit of the particular cell the signal generated by the logic circuitry of the particular cell or the output signal generated by the associated serially preceding cell.

5. A cellular automaton as claimed in claim 3 which is selectively switchable between a mode of operation in which the automaton produces the pseudorandom data and a mode of operation in which the automaton functions as a signal signature analyzer for a binary signal, each of the cells comprising:
   a data input terminal for receiving individual bits of the binary signal;
   exclusive OR means for generating a signal corresponding to the exclusive OR of the received data bits and the signal generated by the logic circuitry of the cell;
   controllable signal gating means for selectively applying to the input terminal of the storage means of the cell the signal generated by the associated logic circuitry or the exclusive OR signal generated by the associated exclusive OR means.

6. A cellular automaton as claimed in claim 3 which is selectively switchable between a mode of operation in which the automaton produces the pseudorandom data and a mode of operation in which the automaton functions as a digital latch for storing a multiplicity of data bits, each of the cells comprising:
   a data input terminal for receiving one of the data bits;
   controllable signal gating means coupled to the data input terminal, to the associated logic circuitry and to the associated storage unit for selectively applying to the input terminal of the associated storage unit a signal corresponding to the one of the data bits and the signal generated by the associated logic circuitry.

7. A cellular automaton as defined in claim 2 in which the logic circuitry of each particular cell receives the output signals produced by the storage units of the associated first and second electrically adjacent cells and applies to the input terminal of the storage unit of the particular cell, a signal having the value $a_{first}(t)$ XOR $a_{second}(t)$.

8. A cellular automaton as claimed in claim 4 which is selectively switchable between a mode of operation in which the automaton produces the pseudorandom data and a mode of operation in which the automaton functions as a shift register, each of the series of cells comprising:
controllable signal gating means for receiving at least the signal generated by the associated logic circuitry and the output signal produced by the storage unit of the associated first electrically adjacent cell and for selectively applying to the input terminal of the storage unit of the particular cell the signal generated by the logic circuitry of the particular cell or the output signal generated by the associated serially preceding cell.

9. A cellular automaton as claimed in claim 4 which is selectively switchable between a mode of operation in which the automaton produces the pseudorandom data and a mode of operation in which the automaton functions as a signal signature analyzer for a binary signal, each of the cells comprising:
a data input terminal for receiving individual bits of the binary signal;
exclusive OR means for generating a signal corresponding to the exclusive OR of the received data bits and the signal generated by the logic circuitry of the cell;
controllable signal gating means for selectively applying to the input terminal of the storage means of the cell the signal generated by the associated logic circuitry or the exclusive OR signal generated by the associated exclusive OR means.

10. A cellular automaton as claimed in claim 4 which is selectively switchable between a mode of operation in which the automaton produces the pseudorandom data and a mode of operation in which the automaton functions as a digital latch for storing a multiplicity of data bits, each of the cells comprising:
a data input terminal for receiving one of the data bits;
controllable signal gating means coupled to the data input terminal, to the associated logic circuitry and to the associated storage unit for selectively applying to the input terminal of the associated storage unit a signal corresponding to the one of the data bits and the signal generated by the associated logic circuitry.

11. A hybrid cellular automaton which generates pseudorandom data, comprising:
a series of cells connected such that each cell receives signals from first and second electrically adjacent cells;
each particular cell in the series of cells having (a) a storage unit for electrically storing a data bit having two distinct states, the storage unit having an output terminal where the current state of the data bit is electrically detectable; and one of either (b) first logic circuitry coupling the storage unit of the particular cell to the storage unit of the associated first electrically adjacent cell and to the storage unit of the second electrically adjacent cell, the logic circuitry responding to the current state of the data bit stored by the particular cell and the data bits stored by the electrically adjacent first and second associated cells by changing the value of the data bit stored by the particular cell according to the following relationship:

$$a(t+1) = a_{first}(t) \text{ XOR } a(t) \text{ XOR } a_{second}(t), \text{ or}$$

(c) second logic circuitry coupling the storage unit of the particular cell to the storage unit of the associated first electrically adjacent cell and to the storage unit of the second electrically adjacent cell, the logic circuitry responding to the current state of the data bits stored by the associated first and second associated cells by changing the value of the data bit stored by the particular cell according to the following relationship:

$$a(t+1) = a_{first}(t) \text{ XOR } a_{second}(t)$$

where, a(t) represents the current state of the data bit stored by the particular cell, $a(t+1)$ represents the next state of the data bit stored by the particular cell, $a_{first}(t)$ represents the current state of the data bit stored by the first electrically adjacent cell, and $a_{second}(t)$ represents the current state of the data bit stored by the second electrically adjacent cell.

12. An automaton cell cooperating with identical cells to produce a pseudorandom data generating automaton, comprising:
a storage unit for electrically storing a data bit having two distinct states, the storage unit having an output terminal where the current state of the data bit is electrically detectable;
logic circuitry for coupling the storage unit of the automaton cell to the storage unit of a first electrically adjacent identical cell and to the storage unit of a second electrically adjacent identical cell, the logic circuitry changing the value of the data bit stored by the automaton cell according to the following relationship:

$$a(t+1) = a_{first}(t) \text{ XOR } a(t) \text{ XOR } a_{second}(t)$$

where, a(t) represents the current state of the data bit stored by the automaton cell, $a(t+1)$ represents the next state of the data bit stored by the automaton cell, $a_{first}(t)$ represents the current state of the data bit stored by the first electrically adjacent identical cell, and $a_{second}(t)$ represents the current state of the data bit stored by the second electrically identical cell.

13. An automaton cell cooperating with identical cells to produce a pseudorandom data generating automaton, comprising:
a storage unit for electrically storing a data bit having two distinct states, the storage unit having an output terminal where the current state of the data bit is electrically detectable;
logic circuitry for coupling the storage unit of the automaton cell to the storage unit of a first electrically adjacent identical cell and to the storage unit of a second electrically adjacent identical cell, the logic circuitry changing the value of the data bits stored by the automaton cell according to the following relationship:

$$a(t+1) = a_{first}(t) \text{ XOR } a_{second}(t) \text{ where,}$$

$a(t+1)$ represents the next state of the data bit stored by the automaton cell, $a_{first}(t)$ represents the current state of the data bit stored by the first electrically adjacent identical cell, and $a_{second}(t)$ represents the current state of the data bit stored by the second electrically identical cell.

14. A method for generating pseudorandom data in a cellular automation comprised of a particular cell and first and second electrically adjacent cells, the method comprising:
 (a) electrically storing a data bit in said particular cell;
 (b) modifying the value of said data bit in said particular cell according to one of the following relationships:

$a(t+1) = a_{first}(t) \text{XOR} a(t) \text{XOR} a_{second}(t)$, or $a(t+1) = a_{first}(t) \text{XOR} a_{second}(t)$, where a(t) represents the current state of the data bit stored by the particular cell, a(t+1) represents the next state of the data bit stored by the particular cell, $a_{first}(t)$ represents the current state of the data bit stored by the first adjacent cell, and $a_{second}(t)$ represents the current state of the data bit stored by the second electrically adjacent cell.

* * * * *

UNITED STATES PATENT AND TRADEMARK OFFICE
CERTIFICATE OF CORRECTION

PATENT NO. : 4,961,159
DATED : October 2, 1990
INVENTOR(S) : Robert McLeod et al.

It is certified that error appears in the above-identified patent and that said Letters Patent is hereby corrected as shown below:

| | |
|---|---|
| Cover Page, | in the ABSTRACT, line 18, change "bit sotred" to --bit stored--; |
| Column 2, | line 66, change "binarY" to --binary--; |
| Column 3, | line 7, change "$2^{n-}1$" to --$2^{n-1}$--; |
| Claim 1, | column 9, line 23, change "cellular automation" to --cellular automaton--; |
| Claim 2, | column 10, line 4, change "of particular cell" to --of each particular cell--; |
| Claim 14, | column 13, line 4, change "automation" to --automaton--. |

Signed and Sealed this

Twenty-third Day of June, 1992

*Attest:*

DOUGLAS B. COMER

*Attesting Officer*   *Acting Commissioner of Patents and Trademarks*